(12) United States Patent
Kurosawa et al.

(10) Patent No.: US 9,416,444 B2
(45) Date of Patent: Aug. 16, 2016

(54) APPARATUS FOR PRODUCING POLYCRYSTALLINE SILICON AND METHOD FOR PRODUCING POLYCRYSTALLINE SILICON

(75) Inventors: Yasushi Kurosawa, Niigata (JP); Shigeyoshi Netsu, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 117 days.

(21) Appl. No.: 13/979,789

(22) PCT Filed: Sep. 20, 2011

(86) PCT No.: PCT/JP2011/005283
§ 371 (c)(1), (2), (4) Date: Jul. 15, 2013

(87) PCT Pub. No.: WO2012/098598
PCT Pub. Date: Jul. 26, 2012

(65) Prior Publication Data
US 2013/0302528 A1    Nov. 14, 2013

(30) Foreign Application Priority Data
Jan. 21, 2011   (JP) .................... 2011-010493

(51) Int. Cl.
*C23C 16/00*   (2006.01)
*C23C 16/24*   (2006.01)
*C01B 33/035*  (2006.01)
*C23C 16/455*  (2006.01)

(52) U.S. Cl.
CPC ............... *C23C 16/24* (2013.01); *C01B 33/035* (2013.01); *C23C 16/45563* (2013.01)

(58) Field of Classification Search
CPC .......................... C23C 16/24; C23C 16/45563
USPC ............................................. 427/255.28, 457
See application file for complete search history.

(56) References Cited

U.S. PATENT DOCUMENTS

2008/0206970 A1    8/2008  Hugo et al.
2010/0055007 A1*   3/2010  Ishii ................. C01B 33/10763
                                          422/199

(Continued)

FOREIGN PATENT DOCUMENTS

CN    101218175 A     7/2008
JP    2002 241120     8/2002

(Continued)

OTHER PUBLICATIONS

Combined Office Action and Search Report issued Jul. 28, 2014 in Chinese Patent Application No. 201180065676.3 (with English translation of category of cited documents).

(Continued)

*Primary Examiner* — Kelly M Gambetta
(74) *Attorney, Agent, or Firm* — Oblon, McClelland, Maier & Neustadt, L.L.P.

(57) ABSTRACT

Raw material gas supply nozzles are arranged within a virtual concentric circle having its center at the center of a disk-like base plate (having an area half as large as an area of the base plate). Raw material gas is ejected at a flow velocity of 150 m/sec or more into a bell jar from the gas supply nozzles. In addition to one gas supply nozzle provided in a center portion of the base plate, three gas supply nozzles can be arranged at the vertex positions of a regular triangle inscribed in a circumscribed circle having its center at the gas supply nozzle in the center portion. With the gas supply nozzles so arranged, a smooth circulating flow is formed within a reactor.

5 Claims, 8 Drawing Sheets

(56) References Cited

U.S. PATENT DOCUMENTS

2011/0229638 A1* 9/2011 Qin .................... 427/255.28
2011/0274926 A1   11/2011 Oda et al.

FOREIGN PATENT DOCUMENTS

| | | |
|---|---|---|
| JP | 2006 206387 | 8/2006 |
| JP | 2008 156212 | 7/2008 |
| JP | 2010 155782 | 7/2010 |
| WO | 2010 098319 | 9/2010 |

OTHER PUBLICATIONS

International Search Report Issued Dec. 20, 2011 in PCT/JP11/005283 Filed Sep. 20, 2011.

* cited by examiner

APPARATUS FOR PRODUCING POLYCRYSTALLINE SILICON AND METHOD FOR PRODUCING POLYCRYSTALLINE SILICON

TECHNICAL FIELD

The present invention relates to a technique for producing polycrystalline silicon, and more particularly, to a position to place a raw material gas supply nozzle in a reactor for producing polycrystalline silicon by a Siemens method, and control of the flow velocity of supplied raw material gas.

BACKGROUND ART

Polycrystalline silicon is used as a raw material for single-crystalline silicon substrates for production of semiconductor devices or substrates for production of solar cells. A Siemens method is known as a method for producing polycrystalline silicon. The Siemens method is a method for obtaining a silicon rod by bringing raw material gas containing chlorosilane into contact with a heated silicon core wire, and thereby performing vapor-phase growth of polycrystalline silicon by a CVD method on the surface of the silicon core wire.

When the vapor-phase growth of polycrystalline silicon is performed by the Siemens method, two vertical silicon core wires and one horizontal silicon core wire are assembled in a square arch shape within a reactor of a vapor-phase growth apparatus. Opposite ends of the square arch-shaped silicon core wires are fixed to a pair of metal electrodes arranged on a base plate of the reactor via a pair of core wire holders. A supply port for raw material gas that causes a reaction, and an exhaust port for reactive exhaust gas are also arranged on the base plate. The configuration as described above is disclosed in, for example, Japanese Patent Laid-Open No. 2006-206387 (Patent Literature 1).

Generally, several tens of square arch-shaped silicon core wires respectively fixed to pairs of metal electrodes arranged on a base plate are arranged in a multi-ring fashion within a reactor. In recent years, along with an increase in the demand of polycrystalline silicon, reactors have increased in size so as to increase the amount of production, and a method for depositing a large amount of polycrystalline silicon in one batch has been employed. The number of silicon core wires arranged within each reactor has also increased with the tendency.

However, when the number of silicon core wires placed in a reactor increases, it becomes difficult to stably supply raw material gas to the surface of each silicon rod. When the raw material gas is unstably supplied, the surface of the silicon rod becomes uneven (popcorn), and as a result, the silicon rod has an uneven thickness to cause a shape defect. When the surface of the silicon rod becomes uneven, polycrystalline silicon also tends to grow abnormally. Furthermore, the cleaning effect of pre-shipment cleaning of polycrystalline silicon is significantly reduced. To eliminate the unevenness in the surface of the silicon rod, the temperature (a reaction temperature) of the surface of the silicon rod may be reduced to generate a mild deposition reaction. In this case, however, polycrystalline silicon is deposited at a lower deposition rate, thereby seriously reducing the productivity and the energy efficiency.

Based on such circumstances, various methods for effectively supplying raw material gas to the surface of each silicon rod have been proposed. For example, in methods disclosed in Japanese Patent Laid-Open No. 2010-155782 (Patent Literature 2) and No. 2002-241120 (Patent Literature 3), the positions of a raw material gas supply nozzle and an exhaust port for reactive exhaust gas are variously improved to allow a deposition reaction to proceed effectively.

However, all of the conventional methods relate to an aspect in which raw material gas supplied into a reactor from a raw material supply nozzle is discharged from an exhaust port for reactive exhaust gas in near-one pass. When the reactor has a large size, the supply amount of raw material gas inevitably increases, so that the production cost becomes higher.

CITATION LIST

Patent Literature

Patent Literature 1:
Japanese Patent Laid-Open No. 2006-206387
Patent Literature 2:
Japanese Patent Laid-Open No. 2010-155782
Patent Literature 3:
Japanese Patent Laid-Open No. 2002-241120

SUMMARY OF INVENTION

Technical Problem

Main factors affecting the rate of deposition in the deposition reaction of polycrystalline silicon are the surface temperature of a silicon rod, the concentration of chlorosilane in reactive gas within a reactor, and the flow velocity of reactive gas in the vicinity of the silicon rod surface. To reduce unevenness in the silicon rod surface and maintain the surface in a favorable state, the above factors need to be controlled under proper balance. To be more specific, it is necessary to reduce the surface unevenness by increasing the gas flow velocity at the silicon rod surface while maintaining the deposition reaction at a relatively high deposition rate by increasing the surface temperature of the silicon rod.

To achieve the above state in a large reactor, a reactive gas circulating flow is preferably formed in the reactor. A chemical reaction between chlorosilane and hydrogen has low reaction efficiency. Thus, a relatively large amount of new raw material gas needs to be supplied to the reactor, so that the deposition reaction is less likely to be affected even when the reaction is performed by forming the reactive gas circulating flow within the reactor.

Particularly, along with an increase in the size of a reaction apparatus, the flow of reactive gas becomes complicated, and a stagnation region tends to be generated locally. The local stagnation region is considered to cause a variation in the concentration of gas inside the reactor or an abnormal local rise in the temperature, thereby causing local generation of popcorn or heavy-metal contamination. The problems can be effectively solved by forming a large amount of reactive gas circulating flow and thereby preventing the generation of the local stagnation region in the reactor.

When the temperature of reactive gas locally exceeds 600° C., a large amount of powder may be generated in the reactor as a by-product of chlorosilane, thereby causing heavy-metal contamination or abnormal growth in a projection-like shape of the silicon rod surface.

Normally, the polycrystalline silicon rod has a high surface temperature of about 900 to 1200° C. during the deposition reaction. Thus, when the reactive gas continues to be locally circulated within the reactor, the reactive gas temperature rises to almost 900 to 1200° C. equal to the temperature of the silicon rod surface. To maintain the reactive gas temperature at about 600° C. or less, the reactive gas needs to be effectively cooled during circulation within the reactor.

To increase the deposition reaction rate, the concentration of chlorosilane gas in the raw material gas is normally increased. In this case, however, the generation of powder is encouraged along with the rise in the reactive gas temperature, and from this perspective, the temperature of the reactive gas also needs to be kept low in the reactor.

In the production of polycrystalline silicon using a large reactor, to suppress the generation of popcorn on the surface of polycrystalline silicon and prevent the generation of powder due to thermal decomposition while performing a fast deposition reaction, a large amount of circulating flow needs to be effectively generated within the reactor to form a high-velocity reactive gas flow within the reactor as described above.

The present invention has been made in view of the aforementioned problems, and it is an object thereof to provide a technique for obtaining a polycrystalline silicon rod by effectively generating a large amount of circulating flow within a reactor to form a high-velocity reactive gas flow within the reactor, and thereby ensuring a high reactive gas flow velocity in the vicinity of the polycrystalline silicon rod and preventing a local rise in the temperature of gas inside the reactor so as to suppress the generation of popcorn on the surface of polycrystalline silicon, and prevent the generation of powder to avoid heavy-metal contamination and abnormal deposition in a projection-like shape while performing a fast deposition reaction.

Solution to Problem

A polycrystalline silicon production apparatus according to the present invention is a polycrystalline silicon production apparatus for producing polycrystalline silicon by a Siemens method, including a reactor whose inner portion is hermetically sealed by a bell jar and a disk-like base plate, and a gas flow control unit that supplies raw material gas into the bell jar at a desired flow rate, wherein electrode pairs that conduct electricity to a plurality of silicon core wires, and one or more gas supply nozzles that supply the raw material gas to an inner space of the bell jar are provided at the base plate, the gas supply nozzles are arranged within a virtual concentric circle having its center at a center of the base plate, and having an area S ($=S_0/2$) half as large as an area $S_0$ of the disk-like base plate, one of the gas supply nozzles being arranged at the center of the base plate, and the gas flow control unit can control the raw material gas ejected from the gas supply nozzles at a flow velocity of 150 m/sec or more.

In one aspect, the gas supply nozzles except the gas supply nozzle arranged at the center of the base plate are arranged at vertex positions of a regular polygon inscribed in a second virtual concentric circle having its center at the center of the base plate.

For example, the inner space of the bell jar of the reactor has a height of 2 m or more and 5 m or less, and the second virtual concentric circle has a radius of 20 to 70 cm.

Also, for example, the regular polygon is a regular n-gon (n is an integer of 3 or more and 8 or less).

Moreover, for example, a gas ejection hole of each of the gas supply nozzles has a diameter of 7 mmφ to 20 mmφ.

A polycrystalline silicon production method according to the present invention, includes depositing polycrystalline silicon on surfaces of the silicon core wires by ejecting the raw material gas at a flow velocity of 150 m/sec or more from the gas supply nozzles by using the above polycrystalline silicon production apparatus. At this time, for example, a raw material gas ejection rate from each of the gas supply nozzles is 300 kg/hr or more.

Advantageous Effects of Invention

By using the polycrystalline silicon production apparatus of the present invention including the above reactor, the raw material gas ejected from the raw material gas supply nozzles arranged within the virtual concentric circle forms a circulating flow within the reactor, which is clearly separated into an ascending flow in a center portion of the reactor and a descending flow along an inner wall of the reactor. Accordingly, high-quality polycrystalline silicon can be obtained by suppressing the formation of an inappropriate high-temperature region due to a locally-closed circulating flow generated in the reactor and thereby suppressing the generation of popcorn on the surface of polycrystalline silicon.

Also, a reactive gas flow around a polycrystalline silicon rod can be effectively maintained at a relatively high velocity. Accordingly, while performing a fast deposition reaction, the present invention can solve the problems, such as a cost increase, of the conventional methods in which a fast deposition reaction is performed not by employing high-velocity circulation, but by increasing the amount of raw material gas.

DESCRIPTION OF EMBODIMENTS

In the following, embodiments of the present invention will be described by reference to the drawings.

Figure 1:
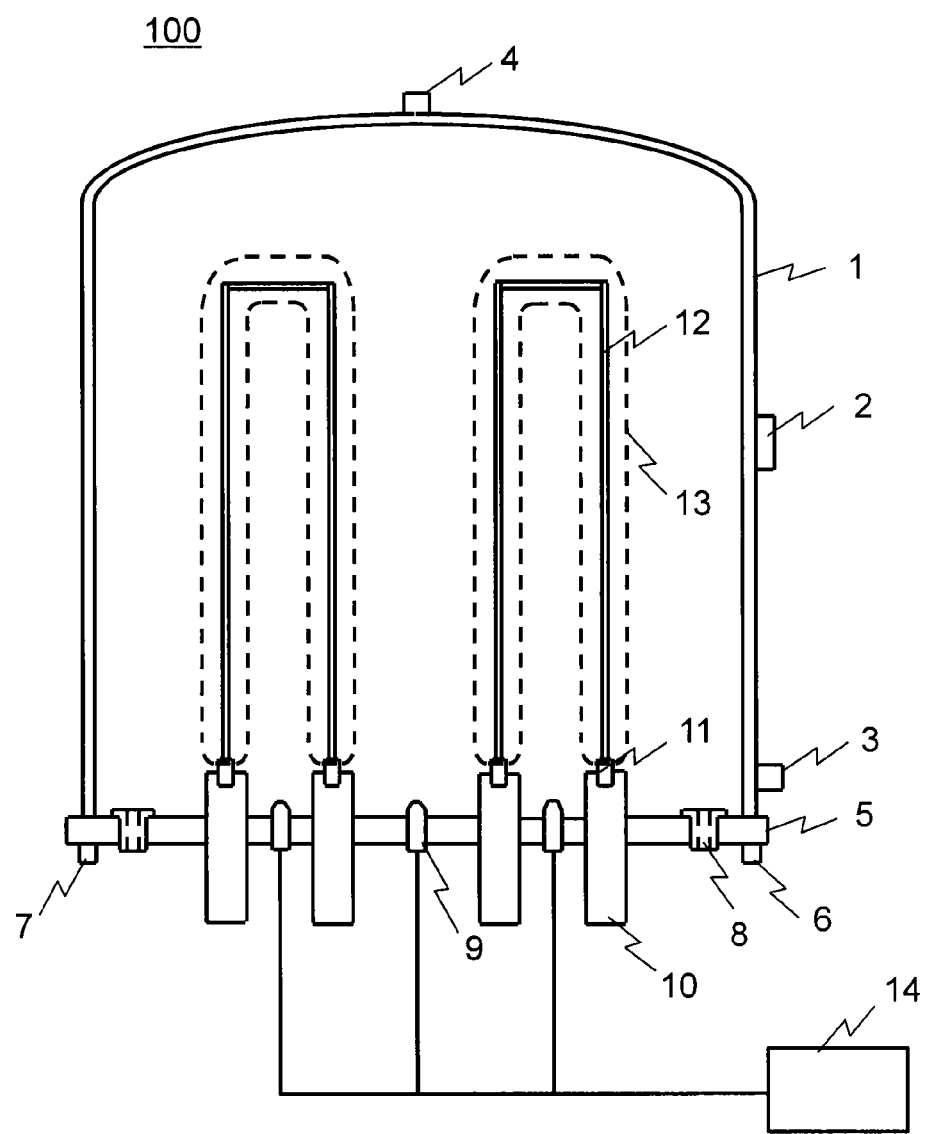
FIG. 1 is a sectional schematic view for explaining a configuration example of a reactor of a polycrystalline silicon production apparatus according to the present invention.

FIG. 1 is a sectional schematic view for explaining a configuration example of a reactor of a polycrystalline silicon production apparatus according to the present invention. An inner portion of a reactor 100 is hermetically sealed by a bell jar 1 including an observation window 2 for allowing a user to check the state of the inner portion, and a base plate 5. A plurality of silicon core wires 12 respectively assembled in a square arch shape are arranged within the hermetically-sealed space, and polycrystalline silicon is deposited on the surfaces of the silicon core wires (or silicon rods 13). Core wire holders 11 and metal electrodes 10 that conduct electricity to the silicon core wires 12 from opposite ends to generate heat, nozzles 9 that supply raw material gas into the bell jar 1, and reactive exhaust gas ports 8 that discharge the gas obtained after reaction to outside of the bell jar 1 are placed at the base plate 5. Raw material gas, the flow velocity and flow rate of which are controlled by a gas flow control unit 14, is supplied from outlets of the nozzles 9. Although the plurality of nozzles 9 are preferably provided as shown in FIG. 1, only one nozzle may be provided.

Normally, the base plate 5 has a disk-like shape, and the metal electrodes 10, the nozzles 9, and the reactive exhaust gas ports 8 provided at the base plate 5 are mostly placed in a concentric fashion. A gaseous mixture of trichlorosilane and hydrogen, which has a relatively high reaction temperature of 900° C. to 1200° C., is mostly used as the raw material gas. Thus, a refrigerant inlet 3 and a refrigerant outlet 4 are respectively provided in a lower portion and an upper portion of the bell jar 1, and a refrigerant inlet 6 and a refrigerant outlet 7 are also respectively provided at opposite ends of the base plate 5, so that refrigerants are respectively supplied to refrigerant paths of the bell jar 1 and the base plate 5 to effect cooling. Water is generally used as the refrigerant. Also, the bell jar 1 has an inner surface temperature of about 100° C. to 400° C. during a deposition reaction.

Figure 2:
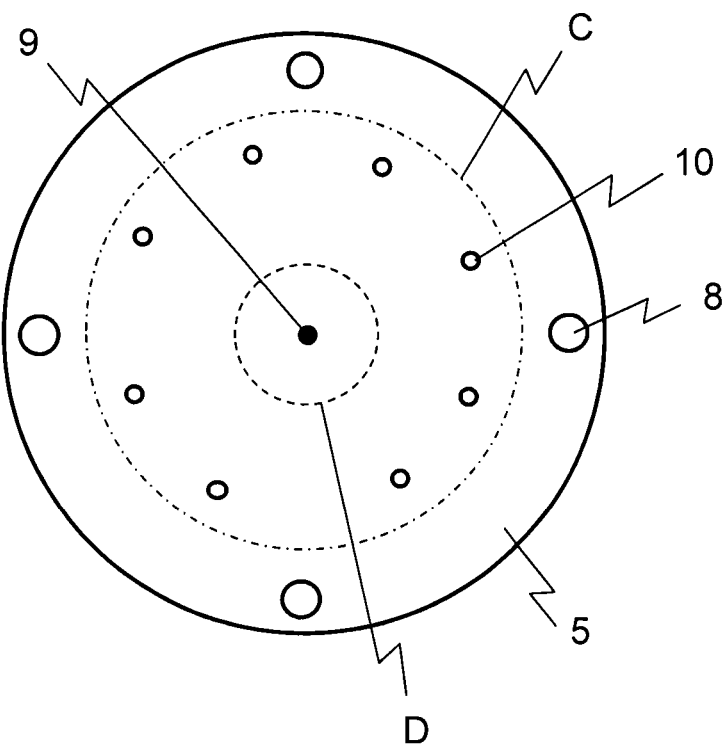
FIG. 2 is an upper-surface schematic view of a base plate for explaining, as an example, an arrangement aspect of a raw material gas supply nozzle and reactive exhaust gas ports provided in the reactor of the polycrystalline silicon production apparatus according to the invention.
Figure 3:
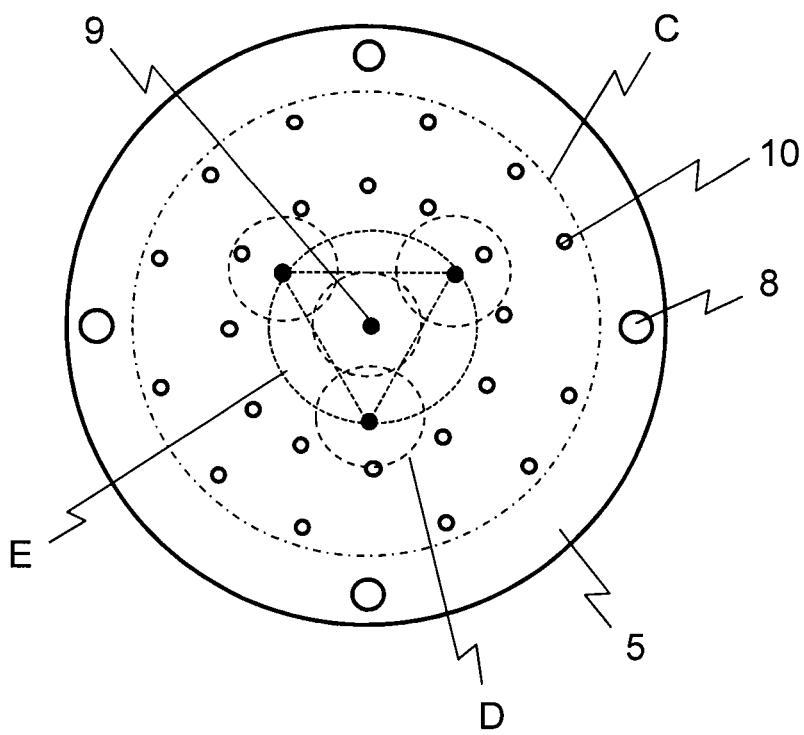
FIG. 3 is an upper-surface schematic view of the base plate for explaining, as an example, an arrangement aspect of the raw material gas supply nozzles and the reactive exhaust gas ports provided in the reactor of the polycrystalline silicon production apparatus according to the invention.

FIGS. 2 and 3 are upper-surface schematic views of the base plate 5 for explaining, as examples, arrangement aspects of the raw material gas supply nozzle(s) 9 and the reactive exhaust gas ports 8 provided in the reactor of the polycrystalline silicon production apparatus according to the present invention.

In the drawings, an alternate long and short dash line denoted by reference character C indicates a virtual concentric circle having its center at the center of the disk-like base plate 5, and having an area $S=S_0/2$ half as large as an area $S_0$ of the base plate 5. The raw material gas supply nozzle(s) 9 are arranged within the concentric circle C. Also, a dash line denoted by reference character D indicates an estimated virtual line showing horizontal spreading of an ejected flow from each gas supply nozzle 9. The raw material gas is ejected from each gas supply nozzle 9 into the bell jar 1 at a flow velocity of 150 m/sec or more except for the early stage of reaction described below. Here, although the arrangement positions of the reactive exhaust gas ports 8 are not specifically limited, the reactive exhaust gas ports 8 are placed outside of the concentric circle C in the aspects shown in FIGS. 2 and 3.

One gas supply nozzle 9 is provided in the example shown in FIG. 2, and four gas supply nozzles 9 are provided in the example shown in FIG. 3. In both the cases, the gas supply nozzle(s) 9 are arranged within the concentric circle C. In the example shown in FIG. 2, the gas supply nozzle 9 is provided in a center portion of the base plate 5. Also, in the example shown in FIG. 3, one gas supply nozzle 9 is provided in the center portion of the base plate 5, and three gas supply nozzles 9 are arranged at the vertex positions of a regular triangle inscribed in a circumscribed circle E having its center at the gas supply nozzle 9 in the center portion.

Various aspects may be employed as the arrangement aspect of the gas supply nozzles 9 in addition to the aspects shown in FIGS. 2 and 3.

FIGS. 4A to 4E are upper-surface schematic views of the base plate for explaining, as examples, other arrangement aspects of the raw material gas supply nozzles and the reactive exhaust gas ports provided in the reactor of the polycrystalline silicon production apparatus according to the invention. In the drawings, the metal electrodes 10 are not shown.

In the aspects shown in FIGS. 4A to 4E, five gas supply nozzles 9 (FIG. 4A), six gas supply nozzles 9 (FIG. 4B), seven gas supply nozzles 9 (FIG. 4C), eight gas supply nozzles 9 (FIG. 4D), and nine gas supply nozzles 9 (FIG. 4E) are respectively provided. In all of the aspects, the raw material gas supply nozzles 9 are arranged within the concentric circle C, and in addition to the gas supply nozzle 9 provided in the center portion of the base plate 5, the other gas supply nozzles 9 are arranged at the vertex positions of a regular polygon inscribed in the circumscribed circle E (a second virtual concentric circle) having its center at the gas supply nozzle 9 in the center portion.

Figure 5:
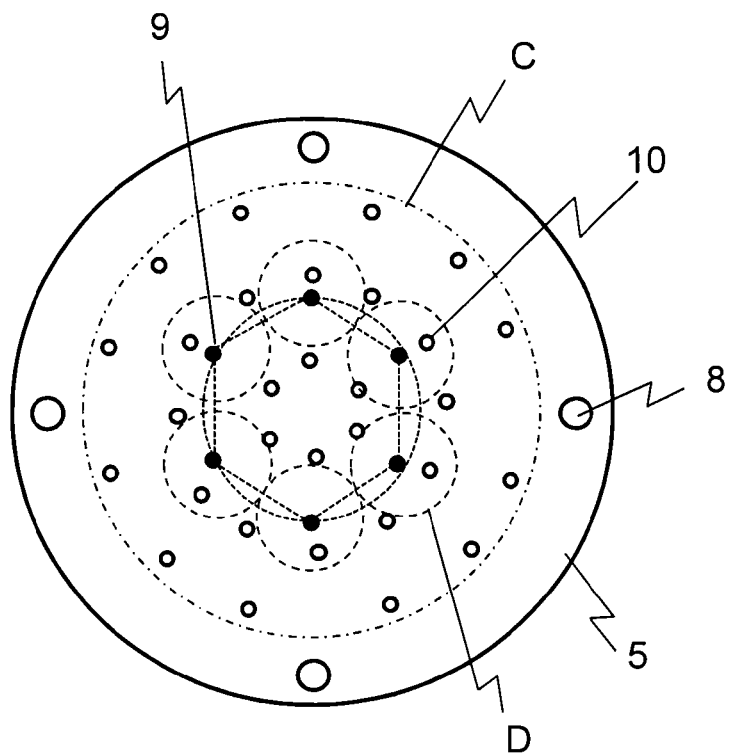
FIG. 5 is an upper-surface schematic view of the base plate for explaining, as a reference example, another arrangement aspect of the raw material gas supply nozzles and the reactive exhaust gas ports provided in the reactor.
Figure 6:
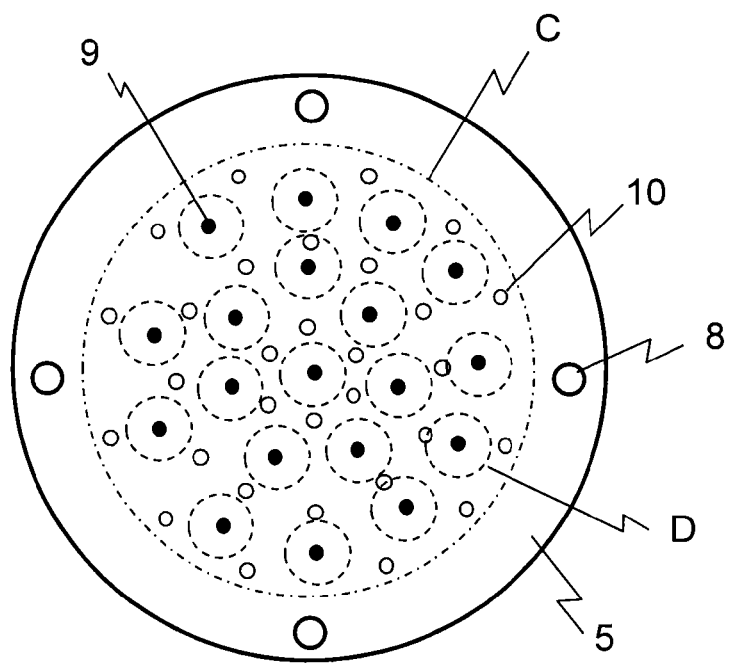
FIG. 6 is an upper-surface schematic view of the base plate for explaining, as a reference example, another arrangement aspect of the raw material gas supply nozzles and the reactive exhaust gas ports provided in the reactor.

FIGS. 5 and 6 are upper-surface schematic views of the base plate 5 for explaining, as reference examples, other arrangement aspects of the raw material gas supply nozzles 9 and the reactive exhaust gas ports 8 provided in the reactor. In the aspects, while the gas supply nozzles 9 are arranged within the concentric circle C, the gas supply nozzle 9 is not provided in the center portion of the base plate 5 (FIG. 5), or the gas supply nozzles 9 are substantially evenly arranged on the base plate 5, and not arranged at the vertex positions of the regular polygon inscribed in the circumscribed circle E having its center at the gas supply nozzle 9 in the center portion (FIG. 6).

The arrangements of the gas supply nozzles 9 as described above are employed in conventional cases. However, in the case of the aspect in which the gas supply nozzle 9 is provided in the center portion of the base plate 5 (FIG. 2), or the aspect in which the gas supply nozzles 9 are arranged at the vertex positions of the regular polygon inscribed in the circumscribed circle E having its center at the gas supply nozzle 9 in the center portion (FIGS. 3 and 4A-E) as shown in FIGS. 2 to 4A-E, reactive gas in the bell jar moves in a stable ascending flow in the center portion of the base plate 5, and in a stable descending flow in a peripheral portion of the base plate 5. As a result, a smooth circulating flow is formed in the bell jar.

The reason is considered to be as follows. When the gas supply nozzles 9 are arranged within the concentric circle C as described above, the raw material gas with a high flow velocity ejected from the gas supply nozzles 9 ascends together with surrounding reactive gas. The ascending gas flow changes direction downward upon colliding with an inner top wall of the bell jar 1, and descends along an inner side wall of the bell jar as a circulating flow. The descending gas flow partially ascends again in the reaction space together with the raw material gas ejected from the gas supply nozzles 9. Since the region of the ascending flow and the region of the descending flow are clearly separated in the entire reactor as described above, the smooth circulating flow is formed. As a result, the formation of a high-temperature region where the temperature of the raw material gas locally rises to an inappropriate temperature is suppressed.

When the reaction space of the reactor, that is, the inner space of the bell jar 1 has a height of 2 m or more and 5 m or less, one gas supply nozzle 9 is preferably arranged in the center portion of the base plate 5, or in addition to one gas supply nozzle 9 in the center portion of the base plate 5, the other gas supply nozzles 9 are preferably arranged at the vertex positions of a regular polygon having a radius of 20 to 70 cm as the above circumscribed circle E.

Figure 7A:
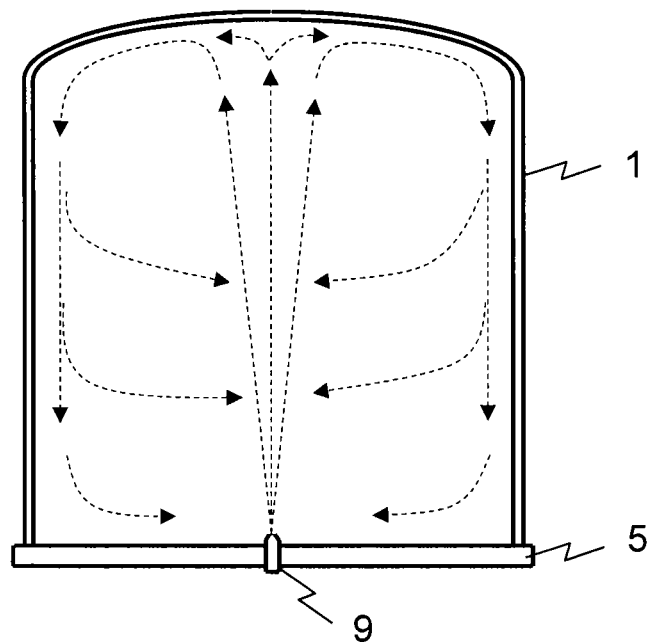
FIG. 7A is a view for schematically explaining the flow within a bell jar of raw material gas ejected from the gas supply nozzle arranged in the aspect shown in FIG. 2.
Figure 7B:
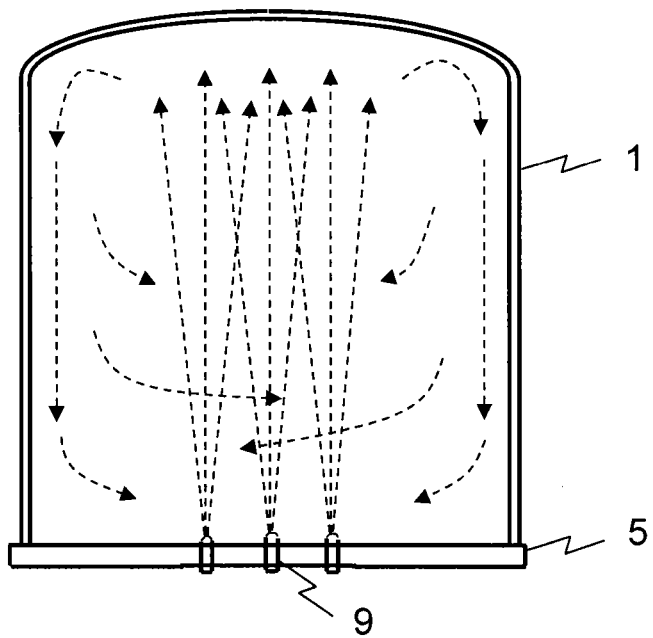
FIG. 7B is a view for schematically explaining the flow within a bell jar of raw material gas ejected from the gas supply nozzles arranged in the aspect shown in FIG. 3.

FIGS. 7A and 7B are views for schematically explaining the flow within the bell jar 1 of the raw material gas ejected from the gas supply nozzle(s) 9 arranged in the aspects shown in FIGS. 2 and 3. In the drawings, the gas flow obtained when the raw material gas is supplied at 150 m/sec or more is schematically shown. As shown in the drawings, the raw material gas with a high flow velocity ejected from the gas supply nozzle(s) 9 arranged in the above aspects ascends together with the surrounding reactive gas, changes direction downward upon colliding with the inner top wall of the bell jar 1, and descends along the inner side wall of the bell jar as the circulating flow. The descending gas flow partially ascends again in the reaction space together with the raw material gas ejected from the gas supply nozzle(s) 9, and the region of the ascending flow and the region of the descending flow are clearly separated in the entire reactor, so that the smooth circulating flow is formed.

By arranging the gas supply nozzles 9 within the concentric circle C as described above, the raw material gas with a high flow velocity ejected from the gas supply nozzles 9 ascends together with the surrounding reactive gas. The ascending gas flow changes direction downward upon colliding with the inner top wall of the bell jar 1, and descends along the inner side wall of the bell jar as the circulating flow. The descending gas flow partially ascends again in the reaction space together with the raw material gas ejected from the gas supply nozzles 9. Because of the smooth circulating gas flow, the local formation of the high-temperature region is suppressed.

The polycrystalline silicon rods 13 provided in the vicinity of the gas supply nozzles 9 directly receive the ascending flow of the raw material gas ejected from the gas supply nozzles 9. However, only some of the polycrystalline silicon rods 13 placed within the reactor directly receive the ascending flow, and the other most polycrystalline silicon rods 13 receive the smooth circulating gas flow composed of the ascending gas flow and the accompanying reactive gas flow.

Figure 8A:
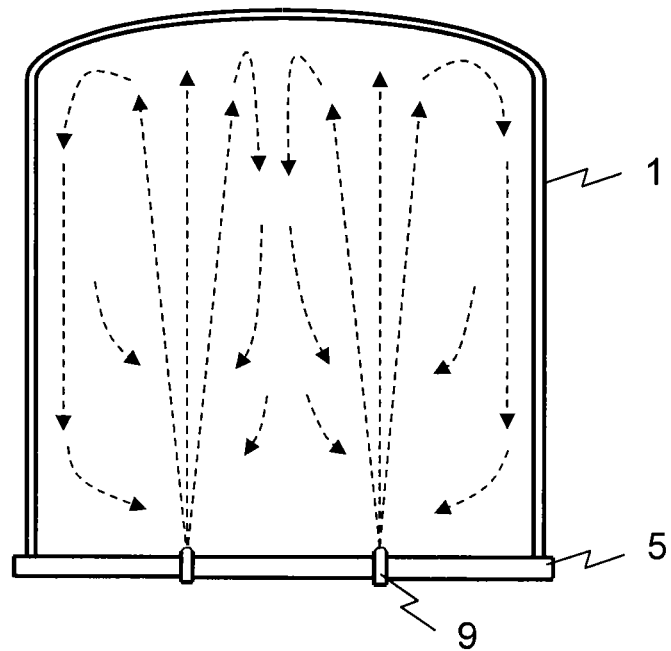
FIG. 8A is a view illustrating an aspect in which no gas supply nozzle is provided in a center portion of the base plate, and the gas supply nozzles thus have a wider interval therebetween.

Meanwhile, in an aspect in which no gas supply nozzle is provided in the center portion of the base plate 5, and as a result, the gas supply nozzles have a wider interval therebetween, for example, as shown in FIG. 8A, a descending circulating flow is formed in the vicinity of a center portion of the reactor. The descending circulating flow is not cooled by the inner wall of the bell jar 1 (the inner wall has a temperature of 150 to 400° C.), and ascends in the reaction space again while maintaining high temperature. The gas circulation as described above may cause shape abnormality, popcorn, or powder of the polycrystalline silicon rods.

Figure 8B:
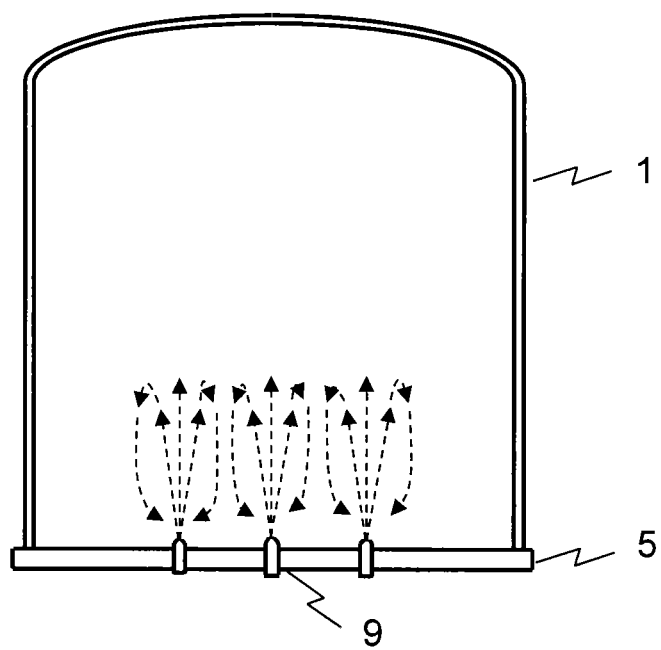
FIG. 8B is a view illustrating an aspect in which the gas ejected from the gas supply nozzles has a low velocity and a low ejection rate.

Also, in an aspect in which the gas ejected from the gas supply nozzles has a low velocity and a low ejection rate, for example, as shown in FIG. 8B, the ejected gas forms a circulating flow only in the lower portion of the reactor without reaching the upper portion of the reactor, thereby generating a reactive gas stagnation region in the upper portion of the reactor. The reactive gas stagnation as described above may cause a rise in the gas temperature, shape abnormality, popcorn, or powder of the polycrystalline silicon rods.

In a process for producing the polycrystalline silicon rods, the flow velocity of the gas supplied from the gas supply nozzles 9 in the early stage of deposition reaction is preferably kept relatively low. This is because the polycrystalline silicon rods 13 have a small diameter in the early stage of deposition reaction, and when the gas is supplied at a high velocity, the polycrystalline silicon rods 13 may fall down or the like due to the impact. It is preferable to supply the raw material gas at a flow velocity of 150 m/sec or more so as to form the smooth circulating flow within the reactor as described above after the diameters of the polycrystalline silicon rods 13 are increased to some extent (for example, after a diameter of about 20 mm$\phi$ or more is obtained).

When a high-velocity reactive gas flow is to be formed within the reactor, it is necessary to supply a large amount of reactive gas and discharge a large amount of gas at the same time in conventional cases. On the other hand, in the present invention, the smooth circulating flow is formed by arranging the gas supply nozzles as described above, and a sufficiently high-velocity reactive gas flow can be formed within the reactor even with the raw material gas supplied at a flow velocity of about 150 m/sec. That is, in accordance with the present invention in which a large amount of circulating flow is formed within the reactor, the high-velocity reactive gas flow can be formed within the reactor even when the raw material gas is supplied at a lower flow velocity than that of the conventional cases. As a result, the supply amount of the raw material gas is suppressed. While it is estimated that the raw material gas is supplied at an average flow velocity of about 3 m/sec to the surface of each of the silicon rods placed within the reactor in the case in which the raw material gas is supplied at a flow velocity of about 150 m/sec, the flow velocity of this level can sufficiently achieve a fast deposition reaction.

As described above, in accordance with the present invention, the deposition reaction of polycrystalline silicon is maintained at a high deposition rate without increasing the production cost, and the generation of shape abnormality, popcorn, or powder of the polycrystalline silicon rods can be suppressed at the same time.

In the present invention, the raw material gas is supplied at a flow velocity of 150 m/sec or more as described above. When the bell jar 1 of the apparatus used herein is assumed to have a general inner space size (a height of 2 to 3 m, and a diameter of 1 to 3 m), the reaction pressure is set to, for example, 0.3 MPa to 0.9 MPa. In this case, the raw material gas ejection rate from each of the gas supply nozzles is preferably 300 kg/hr or more. Also, the number of gas supply nozzles is preferably 1 to 9, and the diameter of a nozzle hole (a gas ejection hole) is preferably 7 mm$\phi$ to 20 mm$\phi$. Moreover, when there are many gas supply nozzles as shown in FIG. 4D or 4E, the amount of gas ejected from the gas supply nozzle provided in the center portion of the base plate may be made larger than the amount of gas ejected from the other gas supply nozzles so as to avoid spatial unevenness in the flow of the ejected gas.

Figure 9:
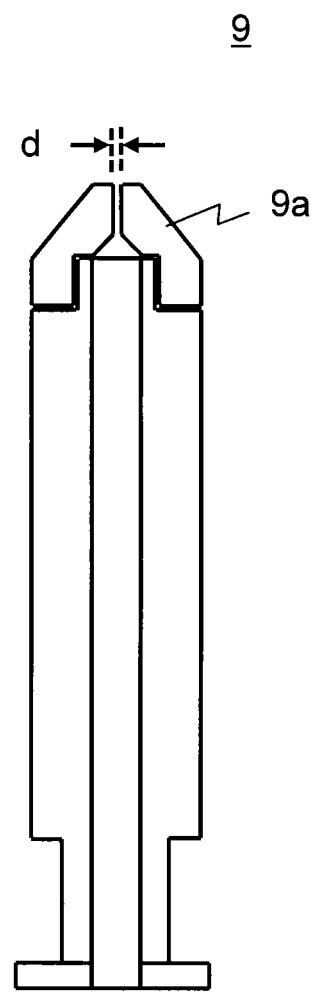
FIG. 9 is a schematic sectional view illustrating one example of the gas supply nozzle according to the present invention.

FIG. 9 is a schematic sectional view illustrating one example of the gas supply nozzle according to the present invention. To maintain a hole diameter d at an appropriate value, metal such as SUS, Ni, and Cu, ceramic, or carbon is preferably used as the material of a nozzle tip 9a.

EXAMPLES

As Example 1, the polycrystalline silicon rods were produced by employing the arrangement of the gas supply nozzles 9 in the aspect shown in FIG. 3.

Figure 4A:
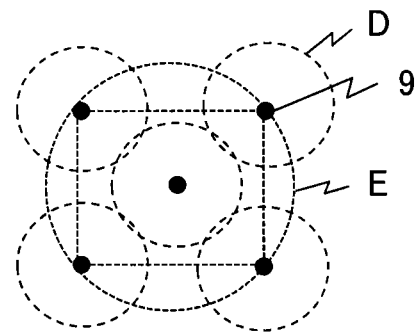
FIGS. 4A-4E are upper-surface schematic views of the base plate for explaining, as examples, arrangement aspects of the raw material gas supply nozzles and the reactive exhaust gas ports provided in the reactor of the polycrystalline silicon production apparatus according to the invention.
Figure 4B:
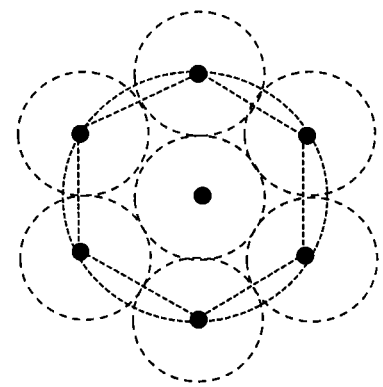
Figure 4C:
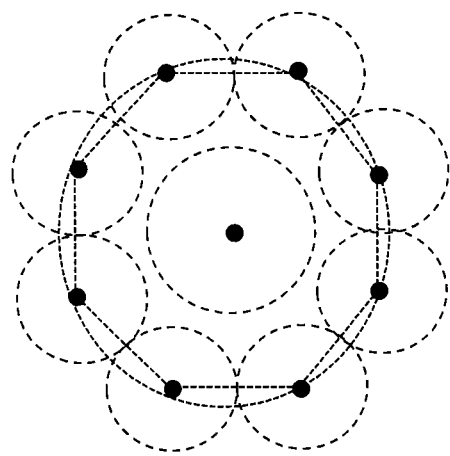
Figure 4D:
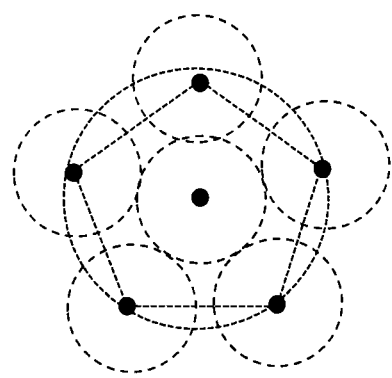
Figure 4E:
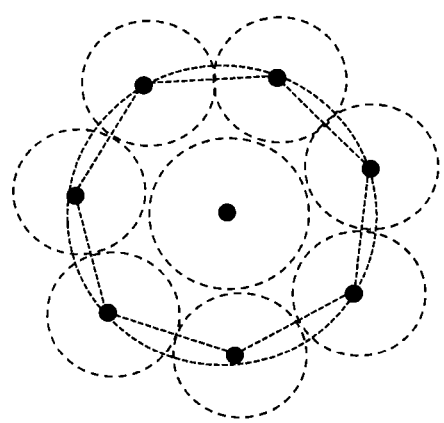

Also, as Example 2, the polycrystalline silicon rods were produced by employing the arrangement of the gas supply nozzles 9 in the aspect shown in FIG. 4C.

In the examples, all the gas supply nozzles 9 were arranged within a virtual concentric circle having its center at the center of the base plate 5, that is, the concentric circle C having the area $S=S_0/2$ half as large as the area $S_0$ of the base plate 5.

Comparative Examples 1 to 4 below were carried out as comparative examples.

As Comparative Example 1, the polycrystalline silicon rods were produced by employing the arrangement of the gas supply nozzles 9 in the aspect shown in FIG. 5. In the comparative example, while the six gas supply nozzles 9 were provided at equal intervals on a concentric circle having its center at the center of the base plate within the concentric circle C, no nozzle was arranged at the center of the base plate.

As Comparative Example 2, the polycrystalline silicon rods were produced by employing the arrangement of the gas supply nozzles 9 in the aspect shown in FIG. 6. In the comparative example, the gas supply nozzles 9 were arranged over substantially the entire surface of the base plate at substantially equal intervals within the concentric circle C.

As Comparative Example 3, the polycrystalline silicon rods were produced by employing the same arrangement of the gas supply nozzles 9 as that of Example 1 except that the nozzle bore was increased to reduce the ejection flow velocity of raw material gas to less than 150 m/sec.

As Comparative Example 4, the polycrystalline silicon rods were produced by employing the same arrangement of the gas supply nozzles 9 as that of Example 2 except that the nozzle bore was increased to reduce the ejection flow velocity of raw material gas to less than 150 m/sec.

Tables 1 to 3 respectively show the deposition reaction conditions and the evaluation results of the obtained polycrystalline silicon rods of Examples 1 and 2, Comparative Examples 1 and 2, and Comparative Examples 3 and 4 as described above. The reaction temperature, the reaction pressure, the type of the raw material gas, the concentration of the raw material gas, the total raw material supply per hour, and the diameter of the finally-obtained polycrystalline silicon rod by production are the same in the respective examples.

TABLE 1

|  | Example 1 | Example 2 |
| --- | --- | --- |
| Reaction temperature | 1080° C. | 1080° C. |
| Reaction pressure | 0.5 MPaG | 0.5 MPaG |
| Reactor height | 3.0 m | 3.6 m |
| Bottom plate diameter | 2.1 m | 3.1 m |
| Raw material gas type | Trichlorosilane + hydrogen | Trichlorosilane + hydrogen |
| Raw material gas concentration | 20% | 20% |
| Nozzle arrangement | FIG. 3 | FIG. 4C |
| Number of nuzzles | 4 nozzles | 7 nozzles |
| Nozzle position | Circumscribed circle with radius of 30 cm | Circumscribed circle with radius of 62 cm |
| Nozzle hole diameter | 11.3 mm$\phi$ | 10.1 mm$\phi$ |
| Flow rate per nozzle | 425 kg/hr | 429 kg/hr |
| Ejection flow velocity from nozzle | 160 m/sec | 200 m/sec |
| Final silicon rod diameter | 120 mm$\phi$ | 120 mm$\phi$ |
| Production rate | 25.3 kg/hr | 39.1 kg/hr |
| Popcorn generation percentage | 3.1% | 2.5% |
| Powder generation | Not generated | Not generated |

TABLE 2

|  | Comparative Example 1 | Comparative Example 2 |
| --- | --- | --- |
| Reaction temperature | 1080° C. | 1080° C. |
| Reaction pressure | 0.5 MPaG | 0.5 MPaG |
| Reactor height | 3.6 m | 3.6 m |
| Bottom plate diameter | 3.1 m | 3.1 m |
| Raw material gas type | Trichlorosilane + hydrogen | Trichlorosilane + hydrogen |
| Raw material gas concentration | 20% | 20% |
| Nozzle arrangement | FIG. 5 | FIG. 6 |
| Number of nuzzles | 6 nozzles | 33 nozzles |
| Nozzle position | Circumscribed circle with radius of 62 cm | Entire surface of bottom plate |
| Nozzle hole diameter | 10.8 mm$\phi$ | 6.3 mm$\phi$ |
| Flow rate per nozzle | 417 kg/hr | 91 kg/hr |
| Ejection flow velocity from nozzle | 170 m/sec | 120 m/sec |
| Final silicon rod diameter | 120 mm$\phi$ | 120 mm$\phi$ |
| Production rate | 36.2 kg/hr | 38.1 kg/hr |
| Popcorn generation percentage | 21.1% | 50.3% |
| Powder generation | Generated in large amount | Generated in large amount |

TABLE 3

|  | Comparative Example 3 | Comparative Example 4 |
| --- | --- | --- |
| Reaction temperature | 1080° C. | 1080° C. |
| Reaction pressure | 0.5 MPaG | 0.5 MPaG |
| Reactor height | 3.0 m | 3.6 m |
| Bottom plate diameter | 2.1 m | 3.1 m |
| Raw material gas type | Trichlorosilane + hydrogen | Trichlorosilane + hydrogen |
| Raw material gas concentration | 20% | 20% |
| Nozzle arrangement | FIG. 3 | FIG. 4(C) |
| Number of nuzzles | 4 nozzles | 7 nozzles |
| Nozzle position | Circumscribed circle with radius of 30 cm | Circumscribed circle with radius of 62 cm |
| Nozzle hole diameter | 10.4 mm$\phi$ | 13.1 mm$\phi$ |
| Flow rate per nozzle | 250 kg/hr | 429 kg/hr |
| Ejection flow velocity from nozzle | 120 m/sec | 120 m/sec |
| Final silicon rod diameter | 120 mm$\phi$ | 120 mm$\phi$ |
| Production rate | 25.8 kg/hr | 38.4 kg/hr |
| Popcorn generation percentage | 15.3% | 20.5% |
| Powder generation | Generated in small amount | Generated in large amount |

As is clear from the results shown in Tables 1 to 3, while the generation percentage of popcorn is high and powder is also generated during the deposition reaction in all of Comparative Examples 1 to 4, the generation percentage of popcorn is significantly reduced and no powder is generated during the deposition reaction in Examples 1 and 2.

By using the polycrystalline silicon production apparatus of the present invention as described above, the raw material gas ejected from the raw material gas supply nozzles arranged within the virtual concentric circle forms the circulating flow within the reactor, which is clearly separated into the ascending flow in the center portion of the reactor and the descending flow along the inner wall of the reactor. Accordingly, high-quality polycrystalline silicon can be obtained by suppressing the formation of the inappropriate high-temperature region due to a locally-closed circulating flow generated in the reactor, and thereby suppressing the generation of popcorn on the surface of polycrystalline silicon.

Also, the reactive gas flow around the polycrystalline silicon rods can be effectively maintained at a relatively high velocity. Accordingly, while performing a fast deposition reaction, the present invention can solve the problems, such as a cost increase, of the conventional methods in which a fast deposition reaction is performed not by employing high-velocity circulation, but by increasing the amount of raw material gas.

INDUSTRIAL APPLICABILITY

The present invention provides the technique for obtaining the polycrystalline silicon rod by effectively generating a large amount of circulating flow within the reactor to form a high-velocity reactive gas flow within the reactor, and thereby ensuring a reactive gas flow velocity in the vicinity of the polycrystalline silicon rod and preventing a local rise in the temperature of gas inside the reactor so as to suppress the generation of popcorn on the surface of polycrystalline silicon, and prevent the generation of powder to avoid heavy-metal contamination and abnormal deposition in a projection-like shape while performing a fast deposition reaction.

REFERENCE SIGNS LIST

100 Reactor
1 Bell jar
2 Observation window
3 Refrigerant inlet (bell jar)
4 Refrigerant outlet (bell jar)
5 Base plate
6 Refrigerant inlet (base plate)
7 Refrigerant outlet (base plate)
8 Reactive exhaust gas outlet
9 Gas supply nozzle
9a Nozzle tip
10 Electrode
11 Core wire holder
12 Silicon core wire
13 Polycrystalline silicon rod
14 Gas flow control unit

The invention claimed is:

1. A polycrystalline silicon production method for producing polycrystalline silicon by a Siemens method by using a polycrystalline silicon production apparatus comprising:

a reactor whose inner portion is hermetically sealed by a bell jar and a disk-like base plate;

a gas flow control unit that supplies raw material gas into the bell jar at a desired flow rate;

electrode pairs that conduct electricity to a plurality of silicon core wires; and a plurality of gas supply nozzles that supply the raw material gas to an inner space of the bell jar provided at the disk-like base plate;

wherein all of the gas supply nozzles provided at the disk-like base plate are arranged within a virtual concentric circle having its center at a center of the disk-like base plate, and having an area S ($=S_0/2$) half as large as an area $S_0$ of the disk-like base plate, one of the gas supply nozzles being arranged at the center of the disk-like base plate, and the gas flow control unit controls the raw material gas ejected from the gas supply nozzles at a flow velocity of 150 m/sec or more, the method comprising:

depositing polycrystalline silicon on surfaces of the silicon core wires by ejecting the raw material gas at a flow velocity of 150 m/sec or more from the gas supply nozzles except for an early stage of silicon deposition reaction.

2. The polycrystalline silicon production method according to claim 1, wherein a raw material gas ejection rate from each of the gas supply nozzles is 300 kg/hr or more.

3. The polycrystalline silicon production method according to claim 1, wherein the gas supply nozzles except the gas supply nozzle arranged at the center of the disk-like base plate are arranged at vertex positions of a regular polygon inscribed in a second virtual concentric circle having its center at the center of the disk-like base plate.

4. The polycrystalline silicon production method according to claim 3, wherein in the polycrystalline silicon production apparatus, the inner space of the bell jar of the reactor has a height of 2 to 5 m, and the second virtual concentric circle has a radius of 20 to 70 cm.

5. The polycrystalline silicon production method according to claim 3, wherein in the polycrystalline silicon production apparatus, the regular polygon is a regular n-gon, where n is an integer of 3 to 8.

* * * * *